United States Patent
Cecil (10) Patent No.: US 10,430,543 B2
(45) Date of Patent: Oct. 1, 2019

(54) MATRIX REDUCTION FOR LITHOGRAPHY SIMULATION

(71) Applicant: Synopsys, Inc., Mountain View, CA (US)

(72) Inventor: Thomas Christopher Cecil, Menlo Park, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 14/506,644

(22) Filed: Oct. 4, 2014

(65) Prior Publication Data

US 2016/0098511 A1    Apr. 7, 2016

(51) Int. Cl.
*G06F 17/50* (2006.01)
*G03F 7/20* (2006.01)

(52) U.S. Cl.
CPC ...... *G06F 17/5081* (2013.01); *G03F 7/70433* (2013.01); *G03F 7/70441* (2013.01); *G03F 7/70466* (2013.01); *G06F 17/5009* (2013.01)

(58) Field of Classification Search
CPC ........ G03F 1/36; G03F 1/144; G03F 7/70441; G03F 7/70125; G03F 7/70433; G06F 17/5009
USPC .................................. 716/50–55; 430/5, 30
See application file for complete search history.

(56) References Cited

U.S. PATENT DOCUMENTS

| | | | |
|---|---|---|---|
| 5,825,647 A * | 10/1998 | Tsudaka | G03F 1/36 430/5 |
| 6,081,658 A | 6/2000 | Rieger et al. | |
| 6,289,499 B1 | 9/2001 | Rieger et al. | |
| 6,928,634 B2 | 8/2005 | Granik et al. | |
| 7,207,029 B2 * | 4/2007 | Beale | G03F 1/80 716/53 |
| 7,234,129 B2 * | 6/2007 | Beale | G03F 1/80 716/53 |
| 7,426,712 B2 | 9/2008 | Kotani et al. | |
| 7,617,478 B2 | 11/2009 | Rieger et al. | |

(Continued)

FOREIGN PATENT DOCUMENTS

JP    2007-025034 A    2/2007

OTHER PUBLICATIONS

"Estimation of Sparse Jacobian Matrices and Graph Coloring Problems," Thomas F. Coleman and Jorge J. More, SIAM Journal on Numerical Analysis, vol. 20, Issue 1 (Feb. 1983), 187-209.

(Continued)

*Primary Examiner* — Nghia M Doan
(74) *Attorney, Agent, or Firm* — Alston & Bird LLP (57) ABSTRACT

A matrix is produced for a semiconductor design. Interactions between mask edges in forming semiconductor shapes are determined and a graph created that shows those interactions. The graph is then partitioned into groups using a coloring algorithm, with each group representing one or more non-interacting mask edges. A lithography simulation is performed for each group, with the edges of that group perturbed, but the edges of other groups unmoved. The partial derivatives are calculated for the edges of a group based on the simulation with those edges perturbed, and used to populate locations in a Jacobian matrix. The Jacobian matrix is then used to solve an Optical Proximity Correction (OPC) problem by finding a mask edge correction vector for a given wafer targeting error vector.

21 Claims, 7 Drawing Sheets

(56) References Cited

U.S. PATENT DOCUMENTS

| | | | |
|---|---|---|---|
| 7,707,538 B2 | 4/2010 | Wong et al. | |
| 7,831,954 B2 | 11/2010 | Rieger et al. | |
| 8,516,402 B1* | 8/2013 | Wang | G03F 1/70 |
| | | | 716/52 |
| 9,679,095 B1* | 6/2017 | Li | G06F 17/5068 |
| 2006/0192935 A1 | 8/2006 | Hansen et al. | |
| 2006/0250589 A1* | 11/2006 | Eurlings | G03F 1/36 |
| | | | 355/52 |
| 2008/0118852 A1 | 5/2008 | Mitsuhashi | |
| 2008/0166639 A1 | 7/2008 | Park et al. | |
| 2009/0039263 A1* | 2/2009 | Matsuoka | G03F 7/70616 |
| | | | 250/311 |
| 2010/0169060 A1 | 7/2010 | Zhu | |

OTHER PUBLICATIONS

WIPO Application No. PCT/US2015/053660, International Search Report, dated Dec. 28, 2015.
WIPO Application No. PCT/US2015/053660, Written Opinion of the International Searching Authority, dated Dec. 28, 2015.
WIPO Application No. PCT/US2015/053660, International Preliminary Report on Patentability, dated Apr. 4, 2017.

* cited by examiner

|    | M1       | M2       | M4       | M5       | M8       |
|----|----------|----------|----------|----------|----------|
| P1 | $d_{11}$ | 0        | 0        | 0        | 0        |
| P2 | 0        | $d_{22}$ | $d_{24}$ | 0        | 0        |
| P3 | 0        | 0        | $d_{34}$ | $d_{35}$ | 0        |
| P4 | 0        | 0        | 0        | 0        | $d_{48}$ |
| P5 | $d_{51}$ | 0        | 0        | 0        | 0        |

MATRIX REDUCTION FOR LITHOGRAPHY SIMULATION

FIELD OF ART

This application relates generally to semiconductor circuit design and more particularly to lithography simulation of semiconductor mask information.

BACKGROUND

Modern integrated circuits are often very large and complex, including tens or even hundreds of millions of transistors, which makes them difficult and expensive to design and validate. The design and fabrication of an integrated circuit involves many different steps, many of which are commonly performed using electronic design automation (EDA) tools running on a computer. Each transistor on the integrated circuit is composed of shapes for diffusion, polysilicon, contacts, metallization, and other structures. Other structures must also be created to connect the transistors or to form other circuit elements, such as capacitors. While performing the various steps in the design process, designers must be acutely aware of the limitations of the manufacturing process. Shapes must be carefully designed to enable the implementation of the desired electronic circuit function at the resulting end of fabrication.

There are numerous structures of miniscule dimension made of various materials in close proximity to one another on each semiconductor chip. Each of those structures has a desired shape, in some cases Manhattan shapes (i.e. polygons with orthogonal edges), but any number of other shapes as well. The structures are formed using many different techniques. Photolithography is commonly used to create structures in the chip. One photolithographic technique for forming a set of structures in a particular layer of a chip is to deposit a layer of material and then to coat the layer with a photosensitive material. A light is then shined through a mask, which possesses a variety of shapes to represent the desired structures, in order to selectively expose the areas of the photo-sensitive material not covered by the shapes in the mask. The exposed areas of the photo-sensitive material, along with the layer of material below those exposed areas in some cases, are then etched away. After the unexposed photo-sensitive material is removed, the desired structures remain. Numerous other techniques can be used to form structures in the semiconductor chip, but many techniques share the use of masks, where a mask includes one or more shapes with edges which are used to create the structures on the chip either directly or indirectly. The shapes on the mask may or may not represent shapes of actual structures forms, but take a shape that is dictated by the fabrication process and the desired shapes of the structures to be formed.

As technologies have advanced, smaller and smaller dimensions, or feature sizes, have been necessary for the masks used by the lithography. Because lithography uses electromagnetic radiation (EMR), such as visible light or ultraviolet light, to selectively expose areas of the chip through a mask, if the dimensions of desired features get smaller than the wavelength of the EMR used, there can be interactions between the mask and the EMR, that impact the actual shapes of the exposed areas and make the exposed shapes different than the shapes on the mask. To accommodate this, the shape of the final exposed area can be used to generate a desired shape of a mask element that is different than the original shape.

SUMMARY

Extensive lithography simulation has been required due to the interactions between various mask edges impacting the resulting semiconductor shapes. Optical Proximity Correction (OPC) problems have further complicated the determination of the semiconductor shapes. As a result calculating locations for moveable mask edges is a very difficult, if not impossible, task to perform.

A computer-implemented method is disclosed for design analysis comprising: obtaining a semiconductor design including mask data; identifying, from the mask data, target points and moveable mask edges; determining interactions between the moveable mask edges wherein the interactions impact resulting semiconductor fabrication shapes; building a graph that shows the interactions; partitioning the graph into a plurality of groups, based on the interactions; and performing lithography simulations based on the groups. In embodiments, the method includes creating a matrix based on the moveable mask edges and the target points; and populating at least some locations of the matrix based on the lithography simulations.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

A single integrated circuit (IC), alternatively referred to herein as a chip or an electronic design, can contain a very large number of semiconductor devices such as transistors. As technology progresses, the physical dimensions or "feature sizes" of individual devices decrease, thereby allowing more devices to be fabricated in a given area. The current minimum feature sizes of stable or mature fabrication processes are typically smaller than the wavelength of visible or even ultraviolet light. Many of these advanced technologies use fabrication processes based on lithographic and chemical processing. However, ever-decreasing feature sizes means that successful optical lithography is becoming increasingly difficult to attain.

One way that designers work around the challenge of depositing features significantly smaller than the wavelengths of available light sources is by carefully controlling mask shapes. Advanced process-window optimization methods, such as ILT (inverse lithography technology), generate finely articulated mask features that comprise a large number of primitive mask-writer features. In very fine geometries, the various mask shapes are designed to interact with one another to create desired features on the semiconductor chip. That is, multiple features in the mask can have an impact on a single point of the desired shape on the chip.

The interactions between features can be mathematically modeled by determining an amount of change caused to a particular portion of a resulting semiconductor shape on the chip by a change to the position of a mask edge. The feature interaction can be quantified as a partial derivative for a wafer targeting error for a target point with respect to the mask edge correction, or movement, of a moveable mask edge. The full set of partial derivatives for all the target points and all the moveable mask edges can be calculated to create a Jacobian matrix using many fewer lithography simulations than previously required. Traditionally, at least one lithography simulation is run for each moveable mask edge. In traditional simulation, a mask edge is perturbed and then the simulation is performed with the single perturbed mask edge to gauge the perturbation's effect on portions of the resulting semiconductor shapes corresponding to each target point. Because there can be many thousands of moveable mask edges, individual edge simulation can result in a very large computational load. Techniques are described herein to dramatically reduce this computational load by reducing the number of lithography simulations that need be run to generate the Jacobian matrix.

In various embodiments, a graph is created to show the interactions between the moveable mask edges. The graph has a node representing each moveable mask edge. If two moveable mask edges interact, an edge in the graph connects the two nodes representing the moveable mask edges. The interaction between the mask edges can be determined using a matrix, using graphical searching, and/or other techniques. The interactions can also be modified manually using heuristic-based shortcuts in some cases. Once the graph is built, it is colored to create groups of nodes that have no interaction with each other, where the moveable mask edges represented by the nodes partitioned together in a single group do not interact with any other moveable mask edges represented by the other nodes in the same group. The coloring is then used to generate perturbation groups where each perturbation group includes the moveable mask edges represented by one color of the graph (a group of non-interactive edges).

A base lithography simulation is run to generate baseline resulting semiconductor shapes. Then, instead of perturbing one moveable mask edge at a time and performing a lithography simulation for each perturbed mask edge, all the moveable mask edges of a perturbation group are perturbed for a single lithography simulation run. The columns of the Jacobian matrix associated with those perturbed mask edges can then be populated by comparing the results of the simulation with the data contained in the pre-perturbation color-coded group of non-interacting edges. Once a simulation has been run on each perturbation group and its results processed, the Jacobian matrix is fully populated. Because of the fact that only the mask edges within an interaction difference can have a significant effect on any single location of the semiconductor chip, there will be relatively few interactions between the significant moveable mask edges as compared to the total number of moveable mask edges. This allows for the use of far fewer different colors to color the graph than the total number of nodes in the graph. In other words, there will be many fewer perturbation groups than the total number of moveable mask edges. This allows fewer total simulations to be computed to fill in the Jacobian matrix entries than would be required in a straightforward implementation with one simulation per matrix column.

One embodiment of the computer-implemented method for design analysis includes obtaining a semiconductor design including mask data and identifying, from the mask data, target points and moveable mask edges. A matrix is then created based on the moveable mask edges and the target points, and interactions are determined between the moveable mask edges. Interactions between moveable mask edges impact resulting semiconductor fabrication shapes. A graph, which includes nodes representing the moveable mask edges, is then built that shows the interactions. The graph is then partitioned into a plurality of groups, based on the interactions. The groups each include one or more non-interactive nodes. Lithography simulations are then performed based on the groups. The simulation execution includes performing a first lithography simulation to determine a first set of resulting semiconductor shapes, and perturbing the locations of the moveable mask edges represented by the first set. Another lithography simulation is then performed to determine a second set of resulting semiconductor shapes, and partial derivatives are calculated based on the perturbations of the moveable mask edges and differences between the first resulting semiconductor shapes and the second resulting semiconductor shapes. Then, at least some locations of the matrix can be populated with the partial derivatives. Lithography simulations are also performed on the other color coded groups, with each lithography simulation applying perturbations to the moveable mask edges represented by a single group of the graph, and partial derivatives calculated for the matrix.

Figure 1:
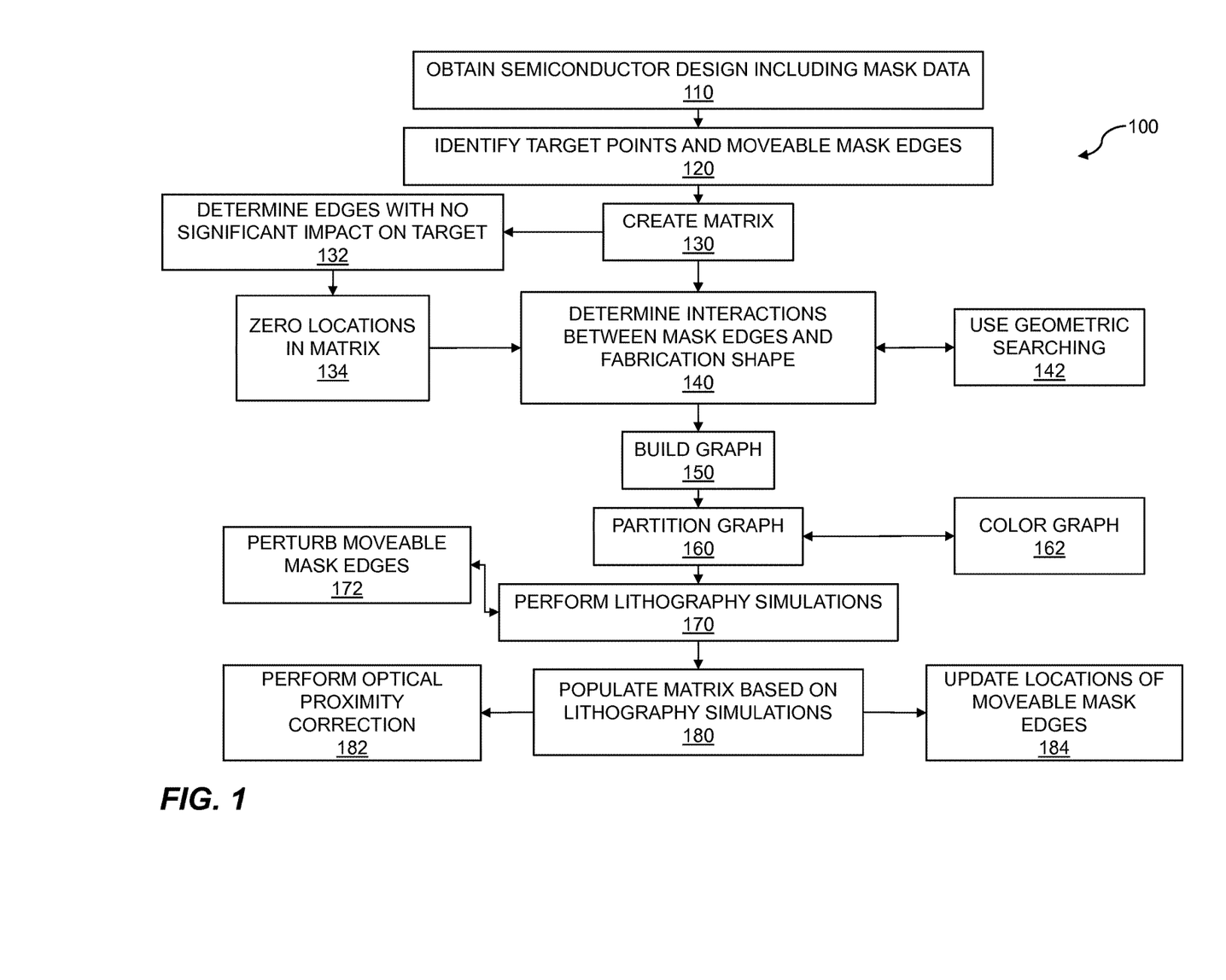
FIG. 1 is a flow diagram for matrix reduction for lithography simulation.

FIG. 1 is a flow diagram for matrix reduction for lithography simulation. The flow 100 describes an embodiment of a computer implemented method for design analysis. The flow 100 includes obtaining a semiconductor design including mask data 110. The semiconductor design, including mask data, can be obtained by reading one or more computer files from computer storage media, by using a logical design to generate a physical design layout including mask data, by user entry, by receiving a communication over a communications link, by scanning images of masks to obtain various layers of the design, or by any other method. The semiconductor design can include information about various layers of the chip, including mask data used for various process steps of the fabrication process used to manufacture the chip. In some embodiments, the layout includes graphic data system II (GDSII) data.

The flow 100 includes identifying, from the mask data, target points and moveable mask edges 120. The moveable mask edges are features in the mask that can be moved in the computer model and impact one or more target points within the final semiconductor design. A moveable mask edge can be an edge of a polygon in a mask data, a portion of a curve of a non-polygonal shape in a mask data, or any other feature in the mask data. A target point is a point on the die of the chip being imaged using one or more mask layers of the mask data. The target point can be a simulated target point or an actual target point on a chip. The target point can be located at a feature of a semiconductor fabrication shape created by photolithographic imaging on the chip using the mask data. The target point can also be located on a feature of a desired shape on the chip. A plurality of target points can describe a resulting semiconductor fabrication shape.

The flow 100 includes creating a matrix 130 based on the moveable mask edges and the target points. Creating the matrix can include allocating space for the matrix in semiconductor memory, a magnetic storage medium, or any other type of non-transitory computer readable storage. In at least one embodiment the matrix has one column for each moveable mask edge and one row for each target. In some embodiments, the values in the matrix are undefined after the matrix is created, but in other embodiments, the matrix is created with initialized values. In some embodiments, the values in the matrix are initialized to a known value, such as a non-zero value, after the matrix is created. In at least one embodiment, the flow 100 can further comprise using a protoshape lookup table for the creating of the matrix. A protoshape lookup table (or perturbation table) can be used to quickly create a unique matrix entry.

In some embodiments, the flow 100 includes determining moveable mask edges which have no significant impact on a portion of a resulting semiconductor shape 132. A significant impact is an effect that is large enough to potentially contribute to a defect in the semiconductor chip. The non-significant mask edges can be determined by any method, but in one embodiment, the determination is done by comparing the locations of the moveable mask edges to the target points. If a moveable mask edge under comparison is more than an interaction distance away from a target point, the moveable mask edge is determined to not have a significant impact on the target point, and thus, on the portion of the resulting semiconductor shape associated with that target point. The interaction distance is a predetermined distance which will vary based on the lithographic technology being used. The interaction distance can be determined by any method including, but not limited to, lithography simulation, physical experimentation, and heuristics. In some cases, the interaction distance is provided by another party, such as the supplier of the lithographic imaging equipment or the semiconductor fabricator. The interaction distance can be a constant for a particular mask layer in a particular lithographic technology, or can be a function of other factors within that mask layer, such as location within the mask, the size of the mask feature, or other parameters. In cases where the interaction distance is a function, the interaction distance is represented by a mathematical function that is evaluated for each comparison. In some embodiments, the function for determining interaction distance defines what is considered a significant impact on the portion of the resulting semiconductor shape.

In another embodiment, a geometric search, which can also be referred to as a geometric query, is used to find the moveable mask edges that are within the interaction distance of a target point representing a portion of a resulting semiconductor shape. The moveable mask edges not identified by the geometric search are determined to have no significant impact on the target point being considered. In some embodiments, the geometric search directly returns the moveable mask edges with no significant impact on the identified target point instead of the mask edges with a significant impact.

In yet other embodiments, a lithography simulation is performed to determine how much a particular moveable mask edge impacts the location of a portion of the resulting semiconductor shape. If the impact is less than a predetermined threshold, or less than a predetermined percentage of the total allowable impact by all moveable mask edges, then the particular moveable mask edge is determined to have no significant impact on the portion of the resulting semiconductor shape under analysis. In some embodiments, a significant impact is defined as a fixed level of sensitivity of the position of the portion of the resulting semiconductor shape to the position of the moveable mask edge.

In some embodiments, the flow 100 continues by zeroing locations of the matrix 134 associated with the determined moveable mask edges and the portion of the resulting semiconductor shape. At least some of the portions of the resulting semiconductor shapes are associated with target points. The matrix, in at least some embodiments, has a single location that corresponds to a particular moveable mask edge and a particular target point. If the particular moveable mask edge is determined to have no significant impact on the portion of the resulting semiconductor shape associated with the particular target point, the corresponding location in the matrix is set to zero. The zeroing described above assumes that the matrix was not initialized to zero. In an alternative embodiment where the matrix was initialized to zero, an equivalent function can be performed by setting locations of the matrix associated with the moveable mask edges that do have a significant impact on the portion of the resulting semiconductor shape to a given non-zero value. The setting to non-zero values has a complementary effect of zeroing locations not set to the non-zero values. The non-zero values occur in locations of the matrix associated with the moveable mask edges that impact a resulting semiconductor shape. In some embodiments, a non-zero value can be used to represent a numerical zero, at least during some stages of the method, and can still be considered zeroing those locations. Manual population of zeroes into at least some locations of the matrix can also be performed.

The flow 100 includes determining interactions between the moveable mask edges wherein the interactions impact resulting semiconductor fabrication shapes 140. An interaction between two moveable mask edges occurs if both of the moveable mask edges have a significant impact on the same portion of the resulting semiconductor shape. Any number of moveable mask edges can interact with the same portion of the resulting semiconductor shape, depending on the details of the semiconductor design and lithographic technology being used. The interactions can be determined using any method. In some embodiments, a geometric search 142 is used in the determining of the interactions. The geometric search can be performed using the set of moveable mask edges, a target point, and an interaction distance. The geometric searching can then return a subset of the moveable mask edges that are within the interaction distance of the target point. In another embodiment, the geometric searching is provided the set of target points, a moveable mask edge, and the interaction distance. The geometric searching then returns a subset of the target points that are within the interaction distance of the moveable mask edge. In some embodiments, the geometric searching returns a subset of elements that are not within the interaction distance.

If a matrix is created and locations of the matrix that are associated with moveable mask edges which have no significant impact on a portion of the resulting semiconductor shape are zeroed, the matrix can be used to determine the interactions between the moveable mask edges as follows: if a row of the matrix has more than one non-zero entry, the moveable mask edges represented by the multiple non-zero entries, i.e. the moveable mask edges represented by the columns containing the non-zero entries, interact in creating the portion of the resulting semiconductor fabrication shape associated with that row of the matrix.

The flow 100 includes building a graph 150 that shows the interactions. The graph can be built as one or more data structures in semiconductor memory, a magnetic storage medium, or another form of non-transitory computer readable media. The data structures can take any form, including, but not limited to, linked lists, arrays, or data objects, and can be used in any combination to represent the graph. In some embodiments, a node in the graph is created for each moveable mask edge. Edges between two nodes of such a graph are created based on the determined interactions between the moveable mask edges. An edge between two nodes in the graph can indicate that the two nodes interact for at least one target point.

In at least one embodiment, the graph can be built using a matrix data structure to represent at least part of the graph. The columns of the matrix can correspond to the moveable mask edges of the semiconductor design with a column of the matrix acting as a node of the graph. The rows can represent any type of information, but in at least one embodiment, a row of the matrix corresponds to a target point in the semiconductor design. The matrix can hold any type of data, including derivative data, zeroes, graph edge information, graph label information, or any other type of information, depending on the embodiment. In some embodiments, additional data structures are used in addition to the matrix to represent the graph, such as one or more data structures to store the node connectivity information, e.g. graph edges, and/or an array to store node labels or colors.

In some embodiments, the graph is built directly from the determined interactions of the moveable mask edges. In other embodiments, the matrix is created and at least partially zeroed based on the interactions of the moveable mask edges, and then the graph is built from the information in the matrix. In embodiments where the graph is built from the matrix, a node of the graph is created to correspond to a column of the matrix and an edge in the graph is created based on pairs of columns having non-zero values in at least one row of the matrix. For example, if a row has four non-zero values, six edges are created in the graph to represent each possible pair of non-zero values. Additionally, if two different rows of the matrix have non-zero values in the same pair of columns a single edge can be created between the two corresponding nodes in the graph.

The flow 100 continues with partitioning the graph 160 into a plurality of groups based on the interactions. The nodes of the graph are grouped, in at least one embodiment, so that the nodes of a group are non-interactive between themselves. If the graph was built from the matrix, the non-interactive grouping can be accomplished by ensuring that no two nodes in a particular group have a non-zero entry in the same row of the matrix.

In some embodiments, a coloring algorithm is used to color the graph 162 and the graph is partitioned groupings based on the colors of the nodes. Using a coloring algorithm to color the graph is simply a special case of graph labeling. A coloring algorithm assigns a label, or "color," to the nodes of the graph in such a way that no two nodes that share an edge of the graph have the same color. Because the graph can be built from the information in the matrix, the coloring algorithm can use matrix column connectivity to assign the same color to groupings of non-interactive nodes. Any coloring algorithm can be used, including coloring algorithms that do not achieve the theoretical minimum number of colors.

In various embodiments, a tradeoff can be made between the computational resources required to color the graph and how close the resulting coloring is to the theoretical minimum number of colors. That is, reducing the number of colors saves computational resources in the long run, but the intense, short-term computational load required to approach the theoretical minimum number of colors can be determined to outweigh any long term benefits. Various coloring algorithms can be used in embodiments, including, but not limited to, a brute-force search, a deletion-contraction algorithm, a sequential algorithm with a smallest-last or incidence-degree ordering, or a greedy algorithm. Once the graph is colored, it can be partitioned into groups with one color per group. In embodiments that use graph coloring, ensuring that no two nodes with non-zero entries in a given row of the matrix are colored the same means that no two nodes that represent interacting moveable mask edges will be in the same group, i.e. have the same color.

The flow 100 includes performing lithography simulations 170 based on the groups. In some embodiments, an initial lithography simulation is performed with all of the moveable mask edges in their original positions to determine the baseline semiconductor shapes resulting from the original mask data. In embodiments, an additional lithography simulation, or set of lithography simulations, can be performed for each group of the partitioned graph. As previously established, because a group does not have any two nodes that interact with each other, the moveable mask edges represented by the nodes of the group can all be perturbed without any interaction with each other. The flow 100 can include perturbing one or more of the moveable mask edges 172 for the lithography simulations. That is, the lithography simulation for a single group can be performed by perturbing all of the moveable mask edges represented by the nodes in that group before running the lithography simulation. In some embodiments, more than one lithography simulation can be performed for one group with different perturbations applied to the moveable mask edges of that group.

The results of the lithography simulations performed with a group of perturbed moveable mask edges can compared to the results of the initial lithography simulation to determine the partial derivatives of a wafer targeting error for a target point with respect to the mask edge correction, or movement, of a moveable mask edge. The partial derivative in the equation to determine the effect caused by edge perturbations on a final semiconductor shape represents an amount of movement of a portion of the resulting semiconductor shape, as determined by observing a target point, which will occur in response to a small movement of a single moveable mask edge. Thus if the moveable mask edge is slightly perturbed, the amount that the perturbation impacts the resulting semiconductor fabrication shape can be predicted using the partial derivatives for the various target points that describe that shape with respect to the mask edge that is moved.

The flow 100 includes populating at least some locations of the matrix 180 based on the lithography simulations. In some embodiments, the partial derivatives that are calculated using the lithography simulations are used to populate locations in the matrix. In at least one embodiment, the partial derivative for each location in the matrix corresponding to the perturbed moveable mask edges represented is calculated. In such an embodiment, partial derivatives having an absolute value less than a predetermined threshold can be set to zero and dismissed as immaterial to the final calculation of a wafer targeting error. In some embodiments, the matrix has some locations zeroed before the lithography simulations are performed and partial derivatives are calculated for the non-zero locations in the matrix, with no additional computation performed for the zeroed locations.

In at least some embodiments, the performing lithography simulations with perturbed moveable mask edges of a group and the populating at least some locations of the matrix are repeated for additional groups of the graph. The simulating and populating can be repeated for every group of the graph. In some embodiments, if none of the moveable mask edges represented by a group of nodes have a significant impact on any resulting semiconductor shapes, the group is skipped, creating a computational savings as no lithography simulations with perturbed moveable mask edges need to be performed on the edges represented by nodes of the group.

If the matrix is populated with the partial derivatives for the various combinations of moveable mask edges and target points, the matrix can be referred to as a Jacobian matrix. A Jacobian matrix includes partial derivatives that are first order for a vector valued function. So, in at least some embodiments, the matrix is a Jacobian matrix. In such embodiments, the partial derivatives for a particular mask edge populate a single column of the matrix and the partial derivatives for a particular target point populate a single row of the matrix.

The flow 100 can further comprise performing optical proximity correction 182 (OPC) based on the simulations. OPC is a photolithography enhancement technique to compensate for image errors due to diffraction or process effects. In at least one embodiment, a baseline semiconductor fabrication shape is compared to the target points describing the desired semiconductor fabrication shape. A correction vector can be generated based on the differences between the baseline semiconductor fabrication shapes and the target points. The Jacobian matrix can be used in conjunction with the correction vector to calculate a movement vector that is calculated to produce the optical proximity correction vector. In some embodiments, the matrix is inverted and multiplied by the correction vector to calculate the movement vector which is then used to update the locations of the moveable mask edges. Thus in some embodiments, the flow 100 can further comprise updating locations for the moveable mask edges 184 based on comparison between the target points and the resulting semiconductor fabrication shape based on the lithography simulations.

To check the accuracy of the calculated correction vector, the updated moveable mask edges can be can be used in another lithography simulation to generate corrected resulting semiconductor fabrication shapes. The corrected resulting semiconductor fabrication shapes can be compared to the target points to see if the correction vector is accurate. In some embodiments, the corrected resulting semiconductor fabrication shapes are not close enough to the target points and the computer-implemented method for design analysis described herein is iterated using the updated moveable mask edges as a starting point. So, obtaining mask data can include optical proximity correction (OPC) and inverse lithography technology (ILT) data in some cases. Various steps in the flow 100 may be changed in order, repeated, omitted, or the like without departing from the disclosed concepts. Various embodiments of the flow 100 may be included in a computer program product embodied in a non-transitory computer readable medium that includes code executable by one or more processors.

Figure 2:
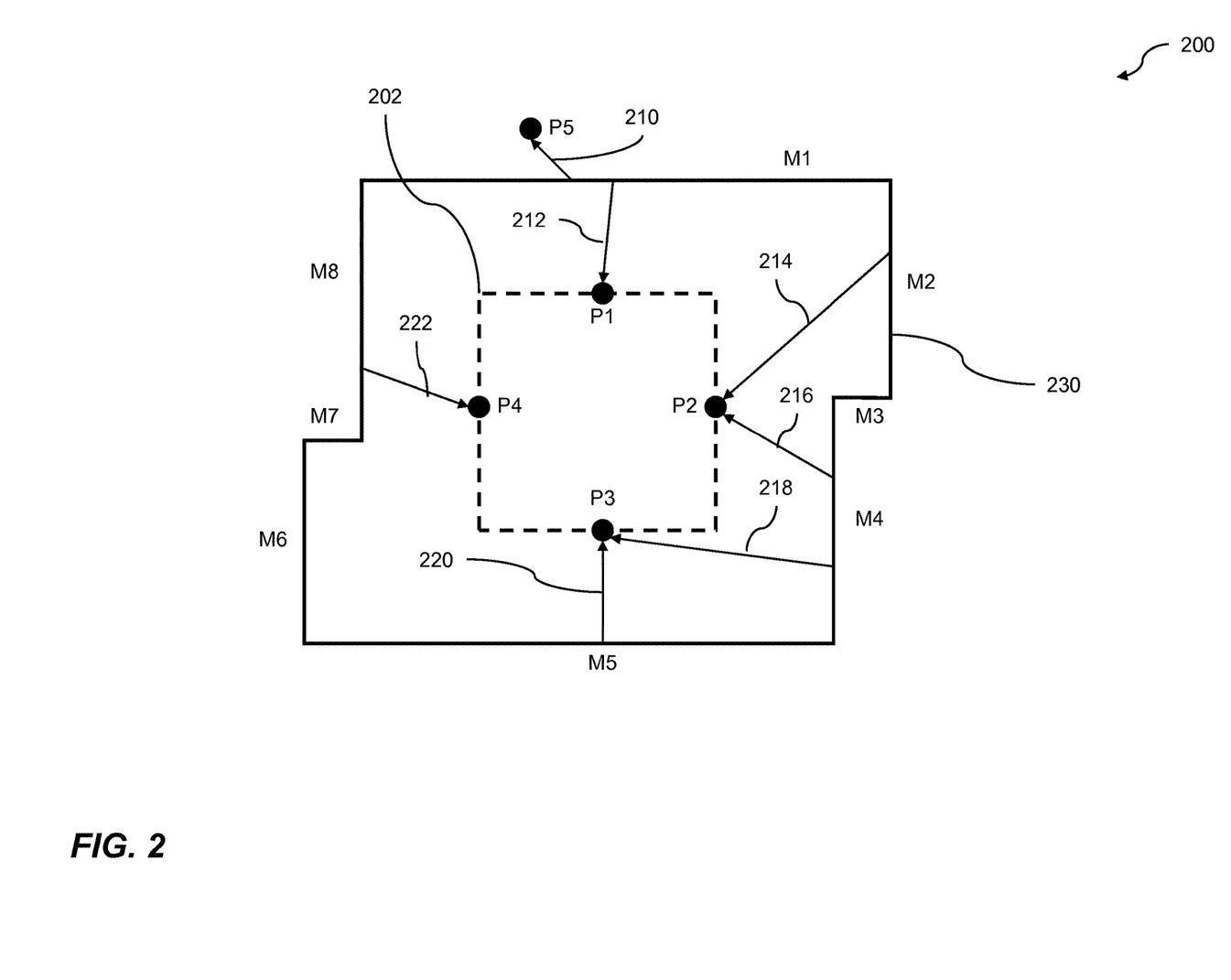
FIG. 2 shows example mapping between mask edges and evaluation points.

FIG. 2 shows example mapping between mask edges and evaluation points. The semiconductor design 200 includes eight example mask edges labeled M1, M2, M3, M4, M5, M6, M7, and M8, and five example target points labeled P1, P2, P3, P4, and P5. At least some of the target points can describe desired shapes for fabrication on a semiconductor device such as the square shape 202 shown in the example. In the example shown, target points P1, P2, P3, and P4 are placed on the four edges of a desired square shape 202. The various mask edges can impact the desired semiconductor shape (here a square 202), an impact that can be gauged by evaluating the effects edge movements have on the target points. Various techniques can be used to determine which mask edges significantly affect which target points, such as the example of using a mask interaction distance as described in FIG. 3.

Figure 3:
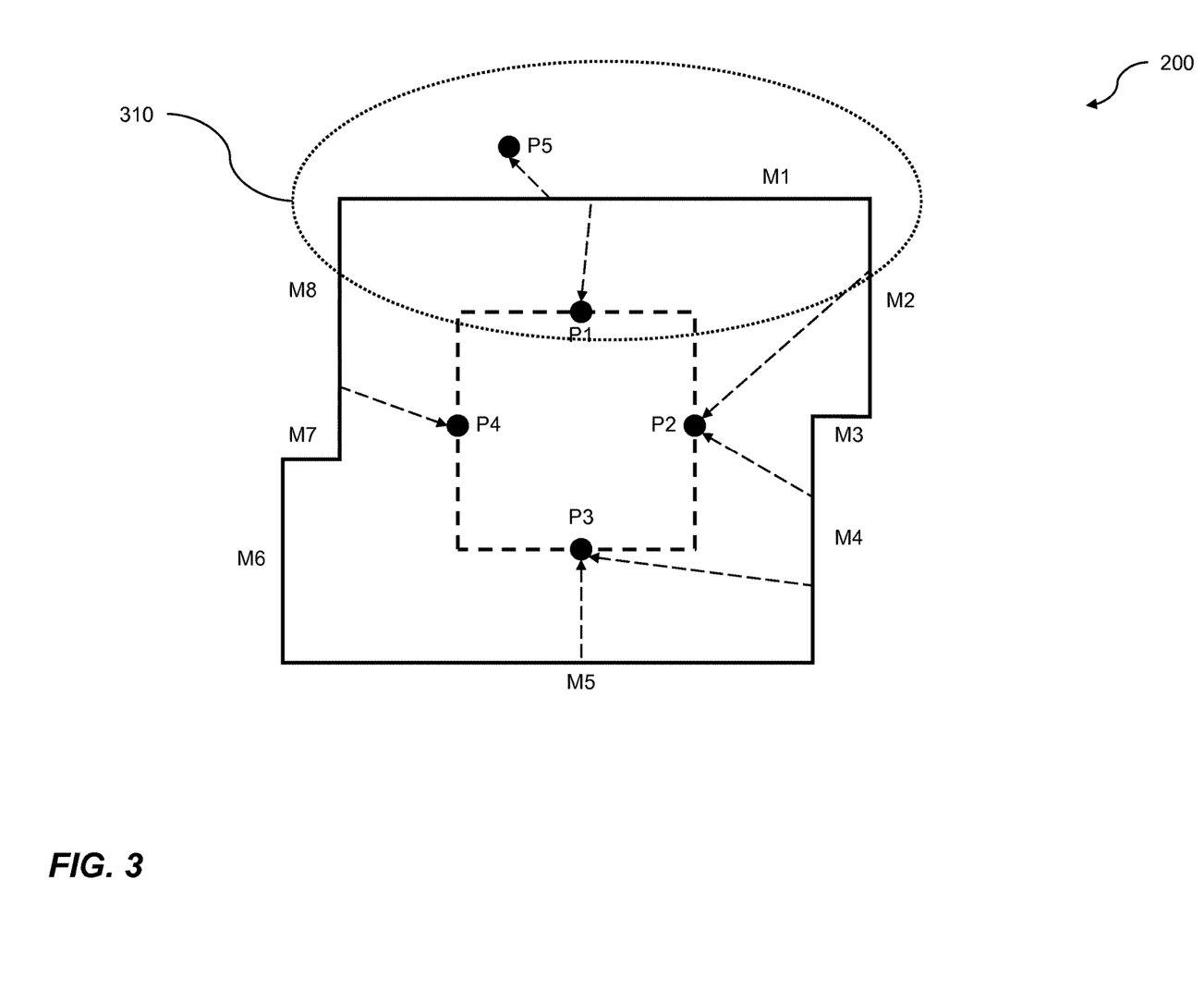
FIG. 3 shows example mask interaction distance.

FIG. 3 shows example mask interaction distance. The same semiconductor design 200 as in FIG. 2 is shown which includes the same moveable mask edges (M1-M8) and the same target points (P1-P5). A mask interaction distance can be used to determine which target points are significantly affected by which mask edges. Any type of algorithm can be used to determine which target points are within a mask interaction distance of a mask edge, including, but not limited to, lithography simulation, graphical searching, geometric calculations, inverse lithographic technology (ILT), mask generation, and heuristic methodologies.

In at least one embodiment, the mask interaction distance for a moveable mask edge is represented by an oval around that mask edge as shown by the oval 310 around the mask edge M1 in the example given. The oval can then be evaluated to determine which, if any, target points lie within that oval. If a target point is inside of the oval, the moveable mask edge associated with the oval is determined to have a significant effect on the target point. Conversely, if a target point is outside of the oval, the moveable mask edge associated with the oval is determined not to have a significant effect on the target point. Other embodiments can use different shapes around the edge, such as a rectangle, or a shape defined by a fixed distance from the edge, to find target points within an interaction distance of the mask edge.

In other embodiments, a distance from the target point to a closest point of the mask edge can be calculated and compared to the value of the interaction distance to determine which target points are affected by the mask edge. The interaction distance can be represented by a constant or an equation, depending on the embodiment. Thus, determining the moveable mask edges that have no significant impact on the resulting semiconductor shape can include finding the moveable mask edges that are more than a mask interaction distance from a target point associated with the resulting semiconductor shape.

The determining of relationships between mask edges and target points using a mask interaction distance or some other algorithm is reflected in the effects shown in FIG. 2. Referring back to FIG. 2, the mask edge M1 has an effect 210 on the target point P5 and also has an effect 212 on target point P1. Similarly, the mask edge M2 has an effect 214 on the target point P2, the mask edge M4 has an effect 216 on the target point P2 and an effect 218 on the target point P3, the mask edge M5 has an effect 220 on the target point P3, and the mask edge M8 has an effect 222 on the target point P4. The mask edges M3, M7, and M6 do not have a significant effect on any of the target points P1-P5 shown. The non-interaction could be due to reasons related to the overall size of the edges, edge distance from the target points, or other factors related to the lithographic process used. One of these mask edges can be perturbed as part of the analysis of the mask edge on resulting semiconductor shapes. The change in a mask edge, and the resulting change in the mask shape, can be considered a protoshape. Thus the protoshape would be a geometric shape corresponding to a difference between the mask shape before and after the perturbation. A lookup table can be used to evaluate changes in the semiconductor shapes. The lookup table can have entries for each of the mask perturbations or protoshapes. The lookup table will then provide a corresponding change in a resulting semiconductor shape.

Figure 4:
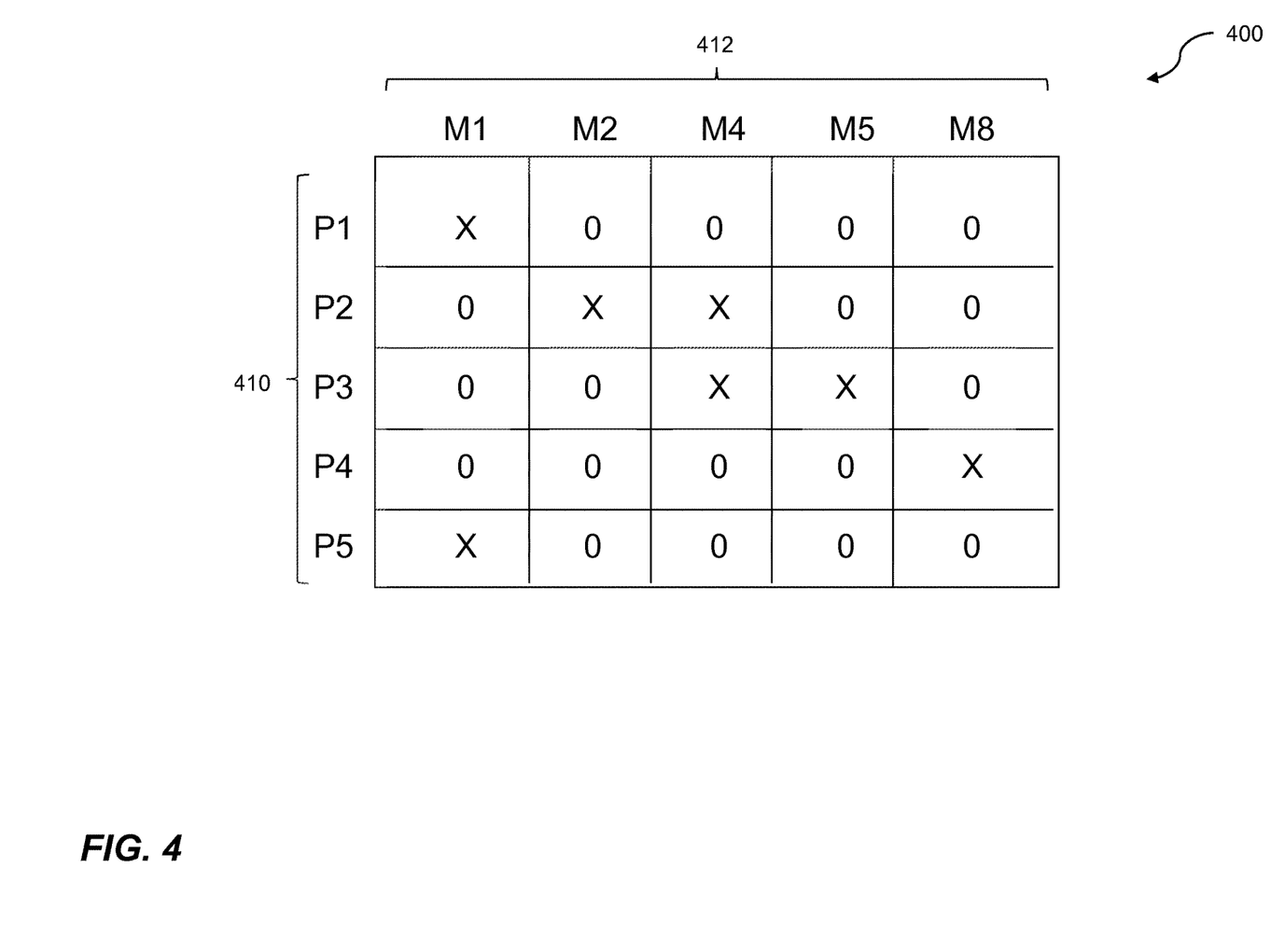
FIG. 4 shows example matrix creation.

FIG. 4 shows example matrix creation. The example matrix 400 is created based on the semiconductor design 200 shown in FIG. 2. The matrix 400 is created to have five rows 410, a number equal to the number of target points P1-P5 shown in FIG. 2, and five columns 412, equal to the number of moveable mask edges M1, M2, M4, M5, M8 in FIG. 2 that have a significant effect on at least one of those target points. In some embodiments, the matrix 400 is created with a number of columns equal to the total number of moveable mask edges in the mask data, such as eight columns based on the eight mask edges M1-M8 of the semiconductor design 200 shown in FIG. 2. In some embodiments, heuristic techniques can be further used to reduce size of the matrix. One example of a heuristic technique would be removing columns of a matrix based on a size of a mask edge being below a certain threshold, such as mask edge M3 and mask edge M7 in FIG. 2, or user removing a column of a matrix based on his or her understanding that the corresponding mask edge can be safely ignored.

In some embodiments, the matrix 400 is created with indeterminate values, although in other embodiments, the matrix is created with initialized values. The matrix can be initialized to a non-zero value after it is created. Matrix locations that correspond to a moveable mask edge and a target point that is not significantly affected by that mask point are then zeroed. In the semiconductor design 200, for example, the mask edge M1 does not affect the target points, P2, P3, or P4, thus the $2^{nd}$, $3^{rd}$, and $4^{th}$ row of the first column of the matrix 400 are zeroed. Similarly, the mask edge M2 does not affect the target points P1, P3, P4, or P5, so the $1^{st}$, $3^{rd}$, $4^{th}$, and $5^{th}$ row of the second column are zeroed. The mask edge M3 does not affect any target points, thus the edge is not included at all in the given matrix 400. However, in some embodiments non-interactive edges are included as a column with all the entries in the column zeroed. But, in embodiments such as the embodiment shown, any column with only zeroed values is eliminated from the created matrix for simplification, thus allowing column M3 to be skipped when generating the matrix. The mask edge M4 does not affect the target points P1, P4 or P5 so the $1^{st}$, $4^{th}$, and $5^{th}$ rows of the third column, which corresponds to mask edge M4, are zeroed. The mask edge M5 does not affect the target points P1, P2, P4, or P5 so the $1^{st}$, $2^{nd}$, $4^{th}$, and $5^{th}$ rows of the fourth column are zeroed. The mask edges M5 and M6 do not affect any target points, so as with the edge M3, edges M5 and M6 are skipped when generating the matrix. The mask edge M8 does not affect the target points P1, P2, P3, or P5 so the $1^{st}$, $2^{nd}$, $3^{rd}$, and $5^{th}$ rows of the fifth column are zeroed. Performing the zeroing ensures that all locations of the matrix with non-zero values have effects on target points.

In some embodiments, the matrix with the zeroed locations is used to determine interactions between the moveable mask edges. The determining interactions can be performed by finding a row of the matrix with more than one location that has not been zeroed. The moveable mask edges corresponding to the columns which share non-zero values across a given row can interact. So in the example matrix 400, the second row has non-zero values in the second column, corresponding to the mask edge M2, and in the third column, corresponding to the edge M4. Similarly, the third row has non-zero values in the third column, corresponding to the mask edge M4, and in the fourth column, corresponding to the edge M5. Therefore it can be determined that mask edge M2 interacts with mask edge M4 and mask edge M4 interacts with mask edge M5. In some embodiments, the populating can populate locations that have not been zeroed using various techniques such as protoshape (in some cases known as flashes) analysis, but in other embodiments, the non-zero values are left as is and are updated later as described below.

Figure 5:
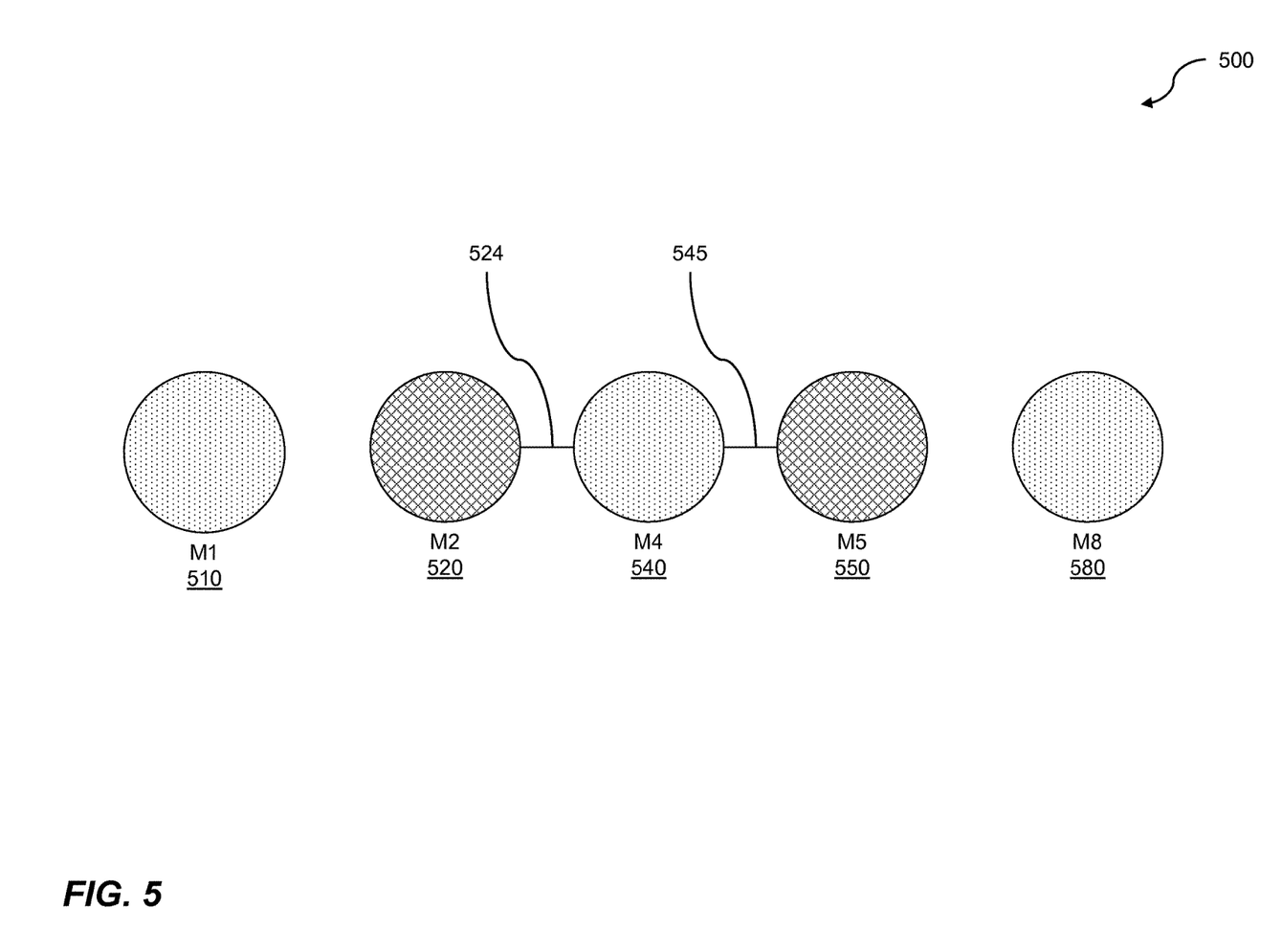
FIG. 5 shows an example interaction graph.

FIG. 5 shows an example interaction graph. The graph 500 contains nodes representing the moveable mask edges. The first node 510 represents the mask edge M1, the second node 520 represents the mask edge M2, the third node 540 represents the mask edge M4, the fourth node 550 represents the mask edge M5, and the fifth node 580 represents the mask edge M8 of the semiconductor design 200 of FIG. 2.

The graph 500 is built to show the interactions of the moveable mask edges. As was determined earlier, the moveable mask edge M2 interacts with the moveable mask edge M4, and the moveable mask edge M4 interacts with the moveable mask edge M5 in the of the semiconductor design 200 of FIG. 2. Thus in order to show these interactions, graph edges are included in the graph 500. For example, a graph edge 524 connects the second node 520 and the third node 540 to show the interaction between the mask edge M2 and the mask edge M4, and a graph edge 545 connects the third node 540 with the fourth node 550 to show the interaction between the mask edge M4 and the mask edge M5.

In embodiments, once the graph 500 has been built it is partitioned into groups that comprise one or more nodes. The groups can be selected in such a way that no node of a group interacts with another node of the same group. Any algorithm can be used to do the partitioning, but in at least one embodiment, the partitioning can include a coloring algorithm, such that only non-interactive nodes share the same color. Any type of coloring algorithm can be used. In some embodiments, the coloring algorithm can be based on a greedy algorithm.

The graph 500 is partitioned into two groups based on a coloring algorithm using two colors, the theoretical minimum number of colors that can be used to color the example graph 500. The first color group includes the first node M1 510, the third node M4 540, and the fifth node M8 580. The second group includes the second node M2 520 and the third node M5 550. The first group represents the first moveable mask edge M1, the fourth moveable mask edge M4 and the eighth moveable mask edge M8. The second group represents the second moveable mask edge M2 and the fifth moveable mask edge M5. The third moveable mask edge M3, the sixth moveable mask edge M6, and the seventh moveable mask edge M7 of FIG. 2 are not represented in any group because none of those edges have a significant effect on any target point in the semiconductor design 200.

In some embodiments, the matrix 400 with zeroed locations of FIG. 4 is used to create the graph 500. In such embodiments, a node is created for each column of the matrix. Two nodes of the graph are connected with a graph edge if there is at least one row of the matrix that contains non-zero values in both of the columns corresponding to those two nodes. Thus the matrix 400 of FIG. 4 has non-zero values in the $2^{nd}$ and $3^{rd}$ columns of the $2^{nd}$ row, so a graph edge 524 is used to connect the second node 520 with the third node 540 of the graph 500. Similarly, there are non-zero values in the $3^{rd}$ and $4^{th}$ columns of the third row of the matrix 400 of FIG. 4, so another graph edge 545 is used to connect the third node 540 with the fourth node 550 of the graph 500. Once the graph has been created, a coloring algorithm can be used to partition the graph 500. Thus, the coloring algorithm can be reflective of matrix column connectivity.

Once the graph 500 has been partitioned, lithography simulations can be performed based on the partitioned groups. As mentioned above, a lithography simulation can be performed on the semiconductor design early in the process using the moveable mask edges in their original positions to determine resulting baseline semiconductor shapes. If, however, a baseline lithography simulation has not yet been performed, it can be performed after the graph has already been partitioned.

In some embodiments, one additional lithography simulation is performed for each group of the graph. Thus, the lithography simulations can comprise a plurality of forward simulations. The interactions among the moveable mask edges and the target points can determine mask perturbation groups. In embodiments, the mask perturbation groups for simulation can correspond to the partitioned groups within the graph. In this embodiment, the moveable mask edges associated with the node of a group are perturbed, or moved a small amount, leaving the moveable mask edges associated with the nodes of the other groups in their original unmoved positions, and a lithography simulation is performed. Thus, a plurality of moveable mask edges are perturbed for one lithography simulation for at least some of the forward simulations. Then, the results of lithography simulation are analyzed to determine what effect the perturbations of those moveable mask edges have on the resulting semiconductor shapes. Because a group does not have any nodes that are directly connected with another node of that group, none of the moveable mask edges associated with a group interact with any other movable mask edge associated with that group. Therefore, all the moveable mask edges associated with a single group can be perturbed for a single lithography simulation without any interaction among the perturbed edges. Because the number of groups is much smaller than the total number of nodes in many cases, many fewer lithography simulations are required than traditional techniques where a single moveable edge is perturbed for each lithography simulation. This can lead to a significant reduction in time and/or computational resources.

Derivatives can be calculated based on each lithography simulation run. A derivative for each target point affected by each perturbed moveable mask edge can be calculated by comparing the baseline semiconductor shapes to the semiconductor shapes generated with the moved edges. A derivative is calculated in some embodiments using the simple formula of the change in position of the portion of a semiconductor shape corresponding to a target point divided by the change in the position of the moveable mask edge caused by the perturbation.

Figure 6:
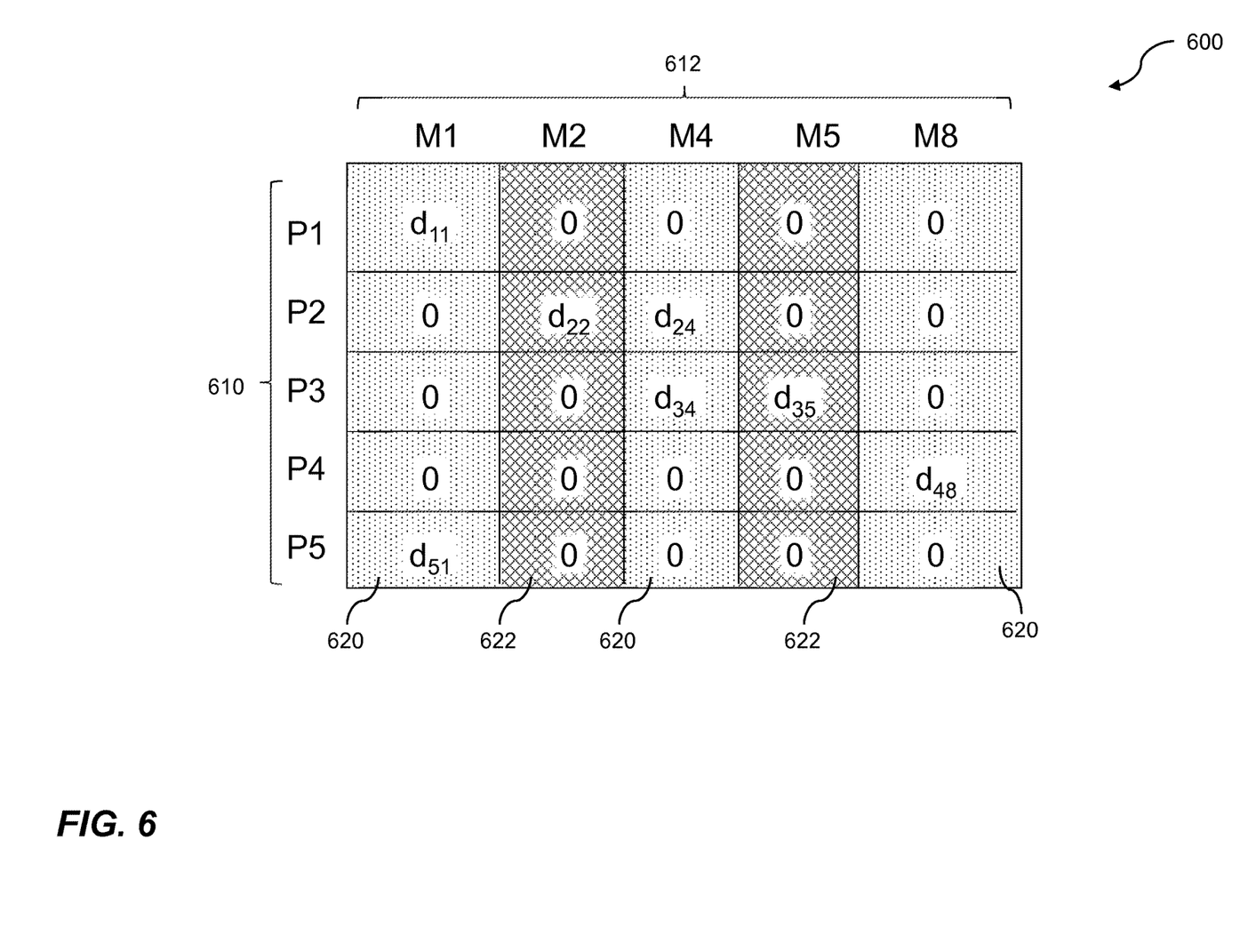
FIG. 6 shows an example matrix of grouped columns.

FIG. 6 shows an example matrix 600 of grouped columns. The grouping of a matrix can be based on the partitioning of a graph associated with the matrix. The lithography simulations based on the partitions of the graph can provide elements of the matrix. That is, the derivatives calculated by perturbing the moveable mask edges of one group can be used to populate non-zeroed locations in the columns of the matrix corresponding the perturbed moveable mask edges. Thus, the matrix can result from mask synthesis. Because the matrix is populated with partial derivatives of a vector function, the matrix is a Jacobian matrix in such embodiments. Many locations in the matrix are zeroed for a typical semiconductor design, thus the matrix can be a sparse matrix.

The example matrix 600 is based on the semiconductor design 200 for FIG. 2. The example matrix may be created directly from the graph 500 of FIG. 5, or can represent a modified version of the matrix 400 of FIG. 4, depending on the embodiment. The matrix 600 has five rows 610 and five columns 612. Locations in the matrix have been zeroed to indicate that the moveable mask edge associated with a column does not affect the target point associated with the row. The matrix 600 is colored based on the coloring of the graph 500 of FIG. 5. The first, third and fifth columns are given a first color 620, and the second and fourth columns are given a second color 622. The mask edges M1, M4, and M8 associated with the first color 620 do not interact with each other, and the mask edges M2 and M5 associated with the second color 622, do not interact with each other.

A lithography simulation can be run with perturbations applied to the mask edges M1, M4, M8 associated with the first color 620 but leaving the mask edges M2 and M5 associated with the second color 622 unmoved. The results of the simulation can be used to calculate the values $d_{11}$, which is the derivative showing the sensitivity of the target point P1 to movement of the mask edge M1, and $d_{51}$, which is the derivative showing the sensitivity of the target point P5 to movement of the mask edge M1. The results of the simulation can also be used to calculate values $d_{24}$, which is the derivative showing the sensitivity of the target point P2 to movement of the mask edge M4; $d_{34}$, which is the derivative showing the sensitivity of the target point P3 to movement of the mask edge M4; and $d_{48}$, which is the derivative showing the sensitivity of the target point P4 to movement of the mask edge M8.

Another lithography simulation can be run with perturbations applied to the mask edges associated with the second color 622, with the mask edges associated with the first color 620 set in original positions. The results of the simulation can be used to calculate values $d_{22}$, which is the derivative showing the sensitivity of the target point P2 to movement of the mask edge M2 and $d_{35}$, which is the derivative showing the sensitivity of the target point P3 to movement of the mask edge M5. So in this example, the Jacobian matrix is calculated using three iterating lithography simulations, one simulation with the moveable edges in original positions, and one additional simulation for each color of the matrix representing perturbation groups of the moveable mask edges.

Figure 7:
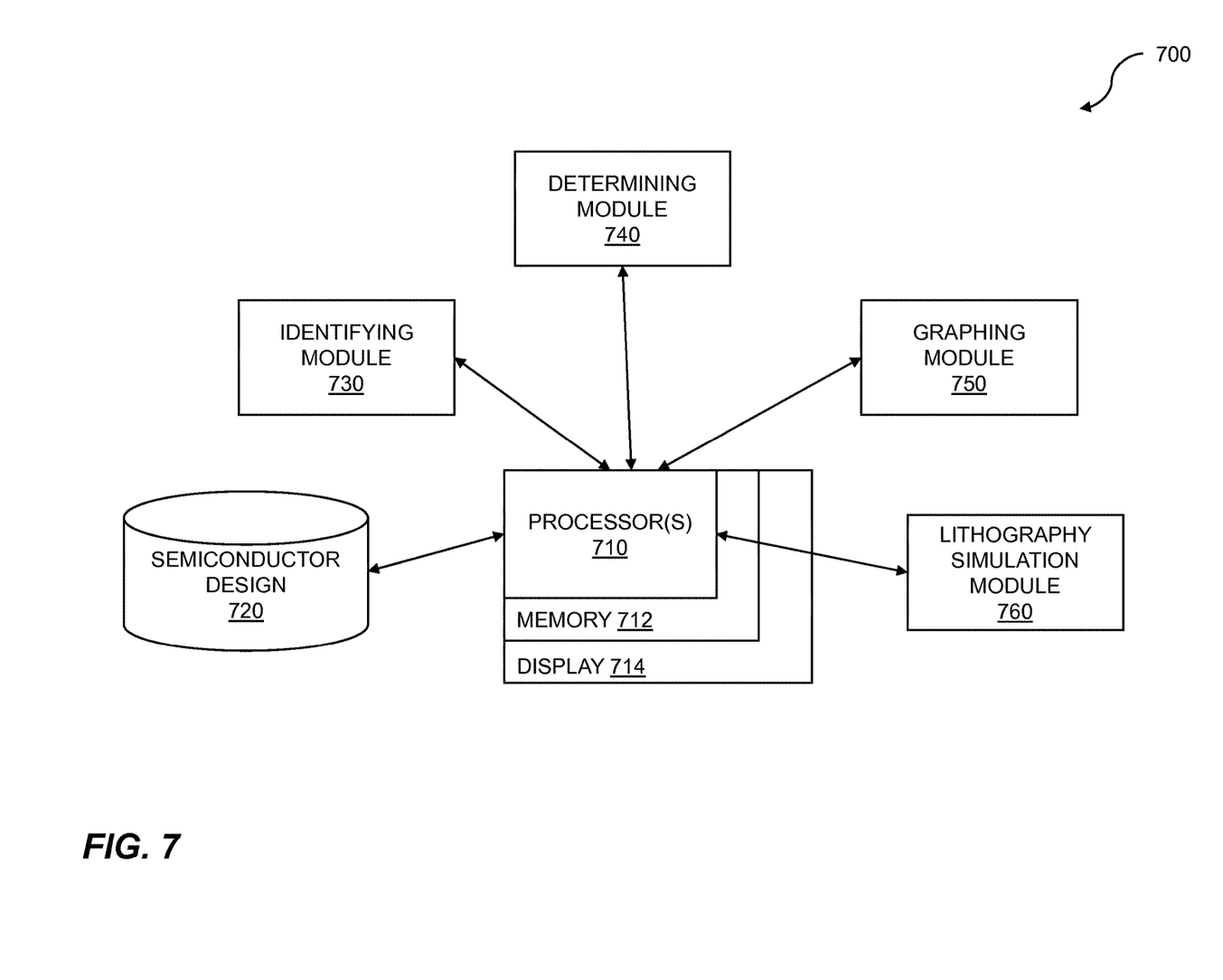
FIG. 7 is a system diagram for matrix reduction for lithography simulation.

FIG. 7 is a system diagram for matrix reduction for lithography simulation. The system 700 can include one or more processors 710 which are coupled to a memory 712, which comprises any type of computer memory, including, but not limited to, various types of semiconductor memory—e.g. dynamic random access memory (DRAM), read only memory (ROM), or flash memory—various types of magnetic storage media—e.g. hard disk drives, floppy disk drives, or bubble memory—or various emerging memory technology devices—e.g. phase change memory, ferroelectric memory, or resistive memory. The memory 712 can be used to temporarily or permanently store computer code and computer instructions, and calculated, temporary, and/or permanent computer data. The data can include any appropriate type or types of data including data for one or more semiconductor designs including mask data. The semiconductor design data can include layout information, layer information, mask data, moveable mask edges, target points, optical proximity correction information (OPC), inverse lithography technology (ILT) information, design information, configuration information, test data and instructions, and the like. A display 714 is also included in some embodiments, and can be any electronic display, including but not limited to, a computer display, a laptop screen, a net-book screen, a tablet screen, a cell phone display, a mobile device display, a remote with a display, a television, a projector, or the like. An embodiment of a computer program running on the one or more processors 710 can perform design analysis.

A semiconductor design 720 is stored on a computer readable media, which can be included in any appropriate type of storage device including a hard disk drive (HDD), a solid-state drive (SSD), or an optical storage media. The semiconductor design can include mask data, moveable mask edges, target points, descriptions of layers, hierarchies of layers, descriptions of rectangles and polygons, or any other type of description of the physical design of an IC. In embodiments, the semiconductor design has mask data that includes target points and moveable mask edges. In some embodiments, the semiconductor design includes OPC and ILT data.

An identifying module 730 can be included in the system 700. The identifying module 730 can be used to identify, from the mask data, target points and moveable mask edges. The mask data can be included within the semiconductor design 720. A determining module 740 can be included in the system 700. The determining module 740 can be used to determine interactions between the moveable mask edges wherein the interactions impact a resulting semiconductor fabrication shape. The determining can be performed using a geometric search, by examining a matrix, or by using any other algorithm to determine which moveable mask edges interact for at least one target point. A graphing module 750 can also be included in the system 700. The graphing module 750 can be used to build a graph that shows the interactions between movable mask edges represented by nodes within the graph. The graphing module 750 also can also be used to partition the graph into a plurality of groups based on the interactions. A coloring algorithm that is reflective of matrix column connectivity can be used to partition the graph. A lithography simulation module 760 can be included in the system 700. The lithography simulation module 760 can be used to perform lithography simulations based on the groups of nodes.

The system 700 can include a computer program product for design analysis. The computer program product can be embodied in a non-transitory computer readable medium and can comprise code for obtaining a semiconductor design including mask data, code for identifying, from the mask data, target points and moveable mask edges, code for determining interactions between the moveable mask edges wherein the interactions impact a resulting semiconductor fabrication shape, code for building a graph that shows the interactions, code for partitioning the graph into a plurality of groups, based on the interactions, and code for performing lithography simulations based on the groups.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for analysis and design of a semiconductor integrated circuit, the method comprising:
   identifying, from mask data based on the semiconductor integrated circuit design, target points and moveable mask edges;
   determining interactions between the moveable mask edges wherein the interactions impact resulting integrated circuit design fabrication shapes associated with the target points;
   building a graph that shows the interactions;
   partitioning the graph into a plurality of groups, based on the interactions;
   performing lithography simulations based on the plurality of groups; and
   performing optical proximity correction (OPC) based on the lithography simulations.

2. The method of claim 1 further comprising:
   creating a matrix based on the moveable mask edges and the target points; and
   populating at least some locations of the matrix based on the lithography simulations.

3. The method of claim 2 further comprising using a protoshape lookup table for the creating of the matrix.

4. The method of claim 2 further comprising using heuristic techniques to reduce size of the matrix.

5. The method of claim 2 further comprising:
   determining moveable mask edges that have no significant impact on a portion of a resulting integrated circuit design shapes; and
   zeroing locations of the matrix associated with the determined moveable mask edges and the portion of the resulting integrated circuit design shapes.

6. The method of claim 5 wherein the determining interactions is done by finding a row of the matrix with more than one location that has not been zeroed where the populating populates locations that have not been zeroed.

7. The method of claim 6 wherein the partitioning comprises a coloring algorithm that is reflective of matrix column connectivity.

8. The method of claim 5 wherein the determining the moveable mask edges that have no significant impact on the resulting integrated circuit design shape comprises finding the moveable mask edges that are more than a mask interaction distance from a target point associated with the resulting integrated circuit design shape.

9. The method of claim 1 wherein the graph comprises nodes representing the moveable mask edges; the plurality of groups each comprise one or more nodes; and no node of a group interacts with another node of the group.

10. The method of claim 9 further comprising:
    creating a matrix based on the moveable mask edges and the target points; and
    populating at least some locations of the matrix with partial derivatives;
    wherein the performing of the lithography simulations comprises:
    performing a first lithography simulation to determine first resulting integrated circuit design shapes;
    perturbing the locations of the moveable mask edges represented by one group from the plurality of groups;
    performing another lithography simulation to determine second resulting integrated circuit design shapes; and
    calculating the partial derivatives based on perturbations of the moveable mask edges and differences between the first resulting integrated circuit design shapes and the second resulting semiconductor shapes.

11. The method of claim 1 further comprising updating locations for the moveable mask edges based on comparison between the target points and a resulting integrated circuit design fabrication shape based on the lithography simulations.

12. The method of claim 11 wherein the target points describe desired shapes for fabrication.

13. The method of claim 1 further comprising using geometric searching for the determining of the interactions.

14. The method of claim 1 further comprising perturbing one or more of the moveable mask edges for the lithography simulations.

15. The method of claim 1 wherein a plurality of moveable mask edges are perturbed for one lithography simulation.

16. The method of claim 1 wherein the interactions between the moveable mask edges and the target points determine mask perturbation groups.

17. The method of claim 1 wherein the lithography simulations comprise a plurality of forward simulations.

18. A computer system configured to analyze and design a semiconductor integrated circuit, the computer system further configured to:
    identify, from mask data based on the semiconductor integrated circuit design, target points and moveable mask edges;
    determine interactions between the moveable mask edges wherein the interactions impact a resulting integrated circuit design fabrication shapes associated with the target points;

build a graph that shows the interactions;
partition the graph into a plurality of groups, based on the interactions;
perform lithography simulations based on the plurality of groups; and
perform optical proximity correction (OPC) based on the lithography simulations.

19. The computer system of claim 18 further configured to create a matrix based on the moveable mask edges and the target points and populate at least some locations of the matrix based on the lithography simulations.

20. The computer system of claim 19 further configured to use a protoshape lookup table for the creating of the matrix.

21. The computer system of claim 19 further configured to use heuristic techniques to reduce a size of the matrix.

* * * * *